United States Patent [19]

McGinley

[11] Patent Number: 4,710,741

[45] Date of Patent: Dec. 1, 1987

[54] ELECTROMAGNET ARRANGEMENTS FOR PRODUCING A MAGNETIC FIELD OF HIGH HOMOGENITY

[75] Inventor: John V. M. McGinley, London, England

[73] Assignee: Picker International Ltd., Wembley, England

[21] Appl. No.: 937,215

[22] Filed: Dec. 3, 1986

[30] Foreign Application Priority Data

Dec. 9, 1985 [GB] United Kingdom ............... 8530295

[51] Int. Cl.$^4$ .............................................. H01F 7/06
[52] U.S. Cl. ................................... 335/296; 335/299; 324/370
[58] Field of Search .................... 335/299, 296, 216; 324/318, 319, 320

[56] References Cited

U.S. PATENT DOCUMENTS 4,584,548  4/1986  Inoue et al. ......................... 335/299
4,658,229  4/1987  Chen et al. .......................... 335/299
4,672,346  6/1987  Miyamoto et al. ................. 335/296

OTHER PUBLICATIONS

Kaminishi K. et al., "Practical Method of Improving the Uniformity of Magnetic Fields Generated by Single and Double Helmholtz Coils", *Review of Scientific Instruments*, 52(3), pp. 447-453, Mar. 1981.

Romeo F. et al., "Magnetic Field Profiling: Analysis and Correcting Coil Design", *Magnetic Resonance Imaging in Medicine*, 1, 1984, pp. 44-65.

Primary Examiner—George Harris
Attorney, Agent, or Firm—Timothy B. Gurin

[57] ABSTRACT

A coil arrangement for producing a magnetic field of high homogeneity, such as is required in magnetic resonance imaging, comprising a single pair of identical annular coils (17A, 17B) disposed coaxially in spaced relationship and a pair of annular members (19A, 19B) of ferromagnetic material disposed coaxially with the coils, symmetrically with respect to the plane which perpendicularly intersects the axis of the coils centrally between them. The coils and ferromagnetic members have dimensions and are relatively positioned so that, with the coils carrying equal energizing currents, the more significant spherical harmonic coefficients are eliminated.

12 Claims, 4 Drawing Figures

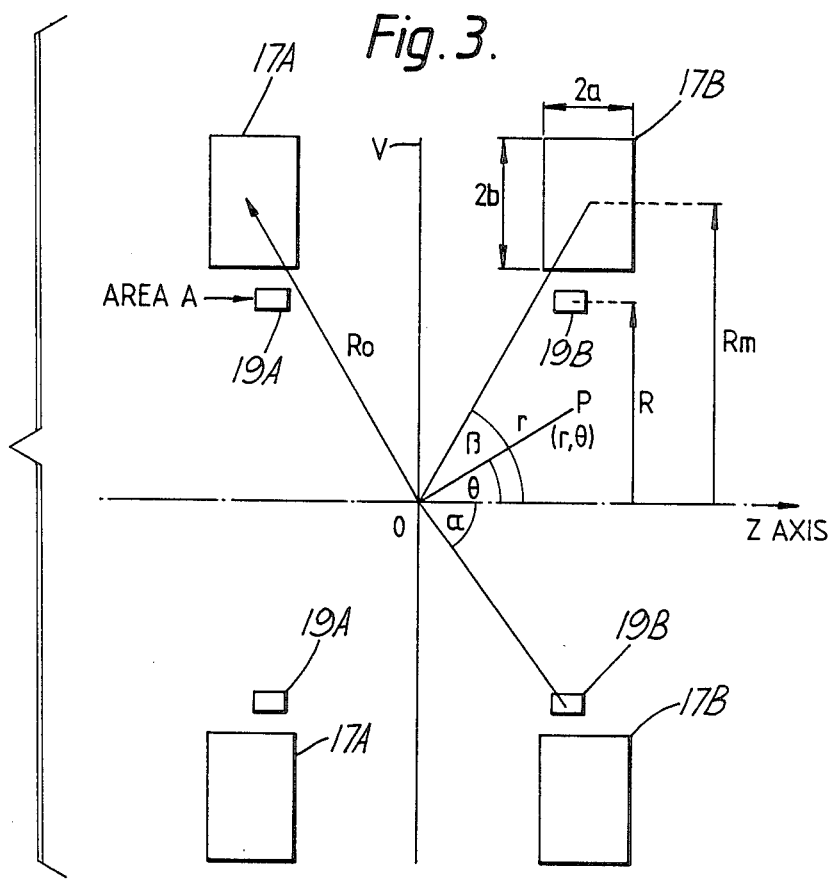
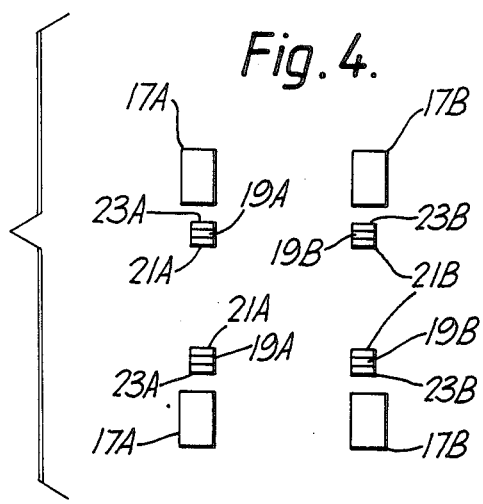

ELECTROMAGNET ARRANGEMENTS FOR PRODUCING A MAGNETIC FIELD OF HIGH HOMOGENITY

This invention relates to electromagnet arrangements.

More particularly the invention relates to electromagnet arrangements for producing a field of high homogeneity in a volume such as is required, for example, in a nuclear magnetic resonance imaging apparatus, to establish an equilibrium axis of magnetic alignment in a body being imaged.

In order to be usable for magnetic resonance imaging an electromagnet arrangement must produce a field in which the axial harmonic coefficients describing the field are substantially zero up to at least the sixth order.

Two known electromagnet arrangements capable of providing such a field will now be described with reference to FIGS. 1 and 2 of the accompanying drawings which are respectively schematic diagrams of the two arrangements;

Referring to FIG. 1, the first arrangement comprises a solenoid 1 with an annular correction coil 3 or 5 at each end, the coils 1, 3 and 5 being disposed coaxially with respect to an axis 7 parallel to the direction of the required magnetic field.

Referring to FIG. 2, the second arrangement comprises two or more identical pairs of annular coils disposed coaxially with respect to an axis 9 parallel to the direction of the required magnetic field so that the coils lie on the surface of a sphere indicated by dotted line 11 in FIG. 2, two pairs of coils 13 and 15 being shown in FIG. 2.

Both these arrangements suffer from disadvantages in respect of transverse access to the homogeneous magnetic field, i.e. in a direction perpendicular to the axis 7 or 9 of the field. In the case of the arrangement of FIG. 1 such access is completely closed off whilst in the case of the arrangement of FIG. 2 the gap between the central coils, coils 15 in FIG. 2, is too small to provide satisfactory access. In the case of magnetic resonance imaging of a patient e.g. for the purposes of medical diagnosis, this rules out the possibility of imaging with the patient's longitudinal axis transverse to the axis of the magnetic field produced by the coil arrangement. Furthermore, in such an application, the closed nature of the coil arrangements of FIGS. 1 and 2 can induce claustrophobic feelings in some patients.

It is an object of the present invention to provide an electromagnet arrangement wherein the above described disadvantages are alleviated.

According to the present invention an electromagnet arrangement comprises a single pair of substantially identical annular coils disposed coaxially in spaced relationship, and a pair of annular members of ferromagnetic material disposed coaxially with the coils symmetrically with respect to a plane which perpendicularly intersects the axis of the coils at a position centrally between the coils, the dimensions and relative positions of the coils and rings being such that, with the coils carrying substantially equal currents, at least two of the spherical harmonic field coefficients are substantially eliminated.

Preferably the dimensions and relative positions of the coils and rings are such that the second, fourth and sixth spherical harmonic field coefficients are substantially eliminated.

In one such preferred arrangement the coils and rings are dimensioned and relatively positioned so as to satisfy the relationship $$\frac{R}{R_o} = \frac{P_E}{P_O} = \frac{Q_E}{Q_D}$$

where R is the mean radius of said rings; Ro is the radius of the sphere on which the mean centres of the cross sections of said coils lie; and $P_E$, $P_D$, $Q_E$ and $Q_D$ are dimensionless quantities as hereinafter defined.

BRIEF DESCRIPTION OF DRAWINGS

FIG. 3 is a schematic diagram of a single pair of coils and a pair of ferrogmagnetic rings disposed coaxially with the coils;

FIG. 4 illustrates, on a reduced scale, a modification of the arrangement of FIG. 3.

Figure 1:
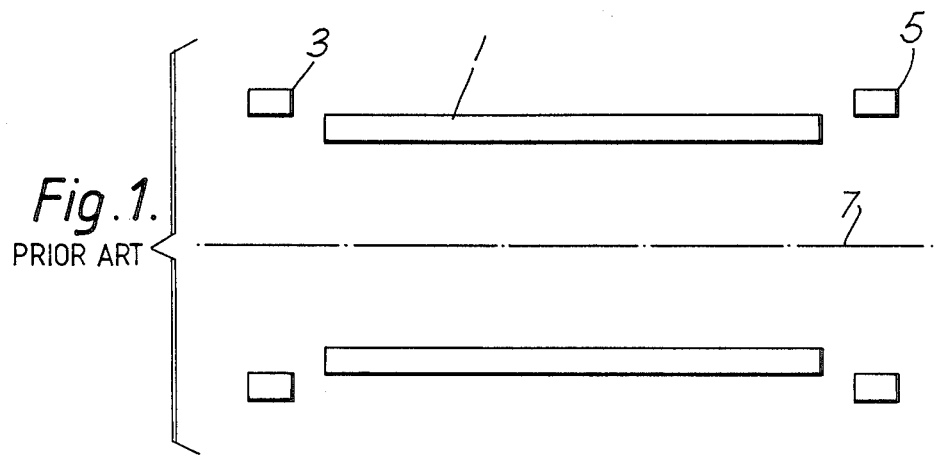
FIGS. 1 and 2 are respectively schematic diagrams of two arrangements in which the axial harmonic coefficients describing the field of high homogeneity are substantially zero up to at least the sixth order.

One electromagnet arrangement in accordance with the invention will now be described, by way of example, with reference to FIGS. 3 and 4 of the accompanying drawings.

The arrangement comprises two identical annular coils 17A and 17B each of which has a rectangular cross-section of width $2a$, thickness $2b$ and mean radius Rm. The coils 17 are dsposed coaxially about a common axis Z and are symmetrically placed about a plane of symmetry V which intersects the axis Z at a point 0 hereinafter referred to as the origin. The mean centre of the cross-section of each of the coils 17 subtends an angle $\beta$ to the Z-axis at the origin.

The arrangement further includes two identical annular rings 19A and 19B of mean radius R made of ferromagnetic material. The two rings 19 are disposed coaxially with the coils 17 symmetrically about the plane V. Each ring 19 has a rectangular cross-section of area A whose mean centre subtends an angle $\alpha$ to the Z-axis at the origin.

In operation the coils 17A and 17B carry equal currents, and are thus suitably energised by being connected in series across a suitable DC supply.

The net magnetic field at a point P having spherical polar coordinates r, $\theta$ with respect to the origin is the sum of the field due to the coils 17 alone and the field due to rings 19 alone. The coils and rings 17 and 19 are dimensioned and positioned so that the coefficients of the spherical harmonic fields due to the coils 17 balance the coefficients of the spherical harmonic fields due to the rings 19 so that the first non-zero spherical harmonic coefficient is the eighth order coefficient.

The required constraints to achieve this may be determined as follows:

The intensity of the magnetic field in the Z direction Hz produced by the arrangement at point P is given by:

$$H_z = S_o + S_2 r^2 P_2(x) + S_4 r^4 P_4(x) + S_6 r^6 P_6(x) + \ldots \quad (1)$$

where
$P_2(x)$ etc. are different order Legendre Polynomials;
So etc. are different order net spherical harmonic coefficients of the arrangement; and
$x = \cos \theta$ It will be appreciated that the object of the design is to eliminate $S_2$, $S_4$ and $S_6$.

The field in the Z-direction Hc due to the coils 17 alone is given by:

$$Hc = H_1 \left( 1 + \frac{E_2}{Ro^2} r^2 P_2(x) + \frac{E_4}{Ro^4} r^4 P_4(x) + \frac{E_6}{Ro^6} r^6 P_6(x) + \ldots \right) \quad (2)$$

where $H_1$ is the field at the origin due to the coils 17 alone;

Ro is the radius of the sphere on which the mean centres of the cross-sections of the coils 17 lie; and $E_2$ etc. are coefficients which are dimensionless functions of the coil dimensions.

$H_1$ is given by $0.4 \pi$ J Ro Ho where J is the current density in the coils 17, and the coefficients $E_2$ etc. are defined by the relation $E_{2n} = C_{2n}/Ho$ where $C_{2n}$ and Ho are defined in formulae 3 to 11 of an article by K. Kaminishi and S. Nawata appearing in the March 1981 issue of Review of Scientific Instruments 52 (3) at pages 447 to 453 and entitled "Practical Method of improving the uniformity of magnetic fields generated by single and double Helmholtz coils", which article is hereby incorporated by reference.

The field in the Z direction due to the rings 19 alone is given by:

$$H_r = MA \left( \frac{D_0}{R^2} + \frac{D_2}{R^4} r^2 P_2(x) + \frac{D_4}{R^6} r^4 P_4(x) + \frac{D_6}{R^8} r^6 P_6(x) + \ldots \right) \quad (3)$$

where

M is the means magnetisation of the rings in the Z direction; and $D_o$ etc. are dimensions coefficients as defined in an article, which is hereby incorporated by reference, by F. Romeo and D.I. Hoult appearing in Magnetic Resonance Imaging in Medicine 1, 1984, pages 44 to 65 entitled "Magnetic Field Profiling: Analysis and corresting Coil Design" from which article it may be deduced that $$D_n = (n+1)(n+2)(\sin\alpha)^{(n+3)} P_{n+2}(\cos\alpha) \quad (4)$$

From equations (1), (2) and (3) expressions for the net coefficients describing the magnetic field can be obtained, as follows:

$$S_0 = H_1 \left( 1 + \frac{WD}{R^2} \right) \quad (5)$$

$$S_2 = H_1 \left( \frac{E_2}{Ro^2} + \frac{WD_2}{R^4} \right) \quad (6)$$

$$S_4 = H_1 \left( \frac{E_4}{Ro^4} + \frac{WD_4}{R^6} \right) \quad (7)$$

$$S_6 = H_1 \left( \frac{E_6}{Ro^6} + \frac{WD_6}{R^8} \right) \quad (8)$$

where $W = MA/H_1$.

The aim is to produce a magnet arrangment in which $S_2 = S_4 = S_6 = 0$. If this is so then from equation (6):

$$\frac{E_2}{Ro^2} + \frac{WD_2}{R^4} = 0 \quad (9)$$

$$\therefore W = \frac{-R^4 E_2}{Ro^2 D_2}$$

and from equation (7):

$$\frac{E_4}{Ro^4} + \frac{WD_4}{R^6} = 0 \quad (10)$$

Substituting equation (9) into equation (10):

$$\frac{E_4}{Ro^4} - \frac{R^4 E_2 D_4}{Ro^2 D_2 R^6} = 0 \therefore \frac{R}{Ro} = \left( \frac{E_2 D_4}{E_4 D_2} \right)^{\frac{1}{2}} \quad (11)$$

Further, from equation (8):

$$\frac{E_6}{Ro^6} + \frac{WD_6}{R^8} = 0 \quad (12)$$

Now substituting equation (9) into equation (12):

$$\frac{E_6}{Ro^6} - \frac{R^4 E_2 D_6}{Ro^2 D_2 R^8} = 0 \therefore \frac{R}{Ro} = \left( \frac{E_2 D_6}{E_6 D_2} \right)^{\frac{1}{4}} \quad (13)$$

Therefore, summarising the results of equations (11) and (13), in order to eliminate simultaneously $S_2$, $S_4$, and $S_6$ we require:

$$\frac{R}{Ro} = \left( \frac{E_2 D_4}{E_4 D_2} \right)^{\frac{1}{2}} = \left( \frac{E_2 D_6}{E_6 D_2} \right)^{\frac{1}{4}} \quad (14)$$

To further condense and separate the requirements of the coils and rings the following relations are defined:

$$P_E = \left| \frac{E_2}{E_4} \right|^{\frac{1}{2}}, Q_E = \left| \frac{E_2}{E_6} \right|^{\frac{1}{4}} \quad (15)$$

$$P_D = \left| \frac{D_2}{D_4} \right|^{\frac{1}{2}}, Q_D = \left| \frac{D_2}{D_6} \right|^{\frac{1}{4}} \quad (16)$$

Thus the coil pair can be characterised by two numbers $Q_E$ and $Q_E$ and the ring pair can be characterised by $P_D$ and $Q_D$. Clearly, conditions (14) are now reduced to:

$$\frac{R}{Ro} = \frac{P_E}{P_D} = \frac{Q_E}{Q_D} \quad (17)$$

This allows for the magnitude of the components only. Constraints must also be placed on the signs of the D and E coefficients. It can be seen from equations (6), (7), and (8) that since W, R and Ro are positive quantities the following restrictions must be imposed to eliminate $S_2$, $S_4$ and $S_6$.

$E_2$ and $D_2$ have opposite signs $E_4$ and $D_4$ have opposite signs $E_6$ and $D_6$ have opposite signs (18)

It will be appreciated that the required constraints are effectively those which cause the contributions to the unwanted net spherical harmonic coefficients due to the coils to balance the contributions to those coefficients due to the rings.

In order to satisfy the constraints of condition (18) it is found in general that $\alpha$ must be in the range 58.5° to 70.5° and $\beta$ within the range 53.6° to 63.4°. Furthermore the constraints are such that the rings 19 will be of smaller radius than the coils 17.

It will be understood that by a curtailment or extension of the above procedure an electromagnet arrangement in accordance with the invention in which a different selection of two or more of the spherical harmonic field coefficients are eliminated may be provided.

The magnetisation M of rings 19 may arise solely from the field induced by coils 17, or alternatively, may arise partly by virtue of the rings 19 being permanently magnetised.

For either of these options the rings 19A and 19B are suitably each sandwiched between two thin annular auxiliary coils 21A and 23A, or 21B and 23B, one on the inside and the other on the outside radial surface of the associated ring, as shown in FIG. 4. The two coils 21 and 23 associated with each ring 19 carry equal and opposite currents and are thus suitably all connected in series. The coils 21 and 23 are used for fine adjustment of the mean magnetisation M in the rings 19 to assist in setting up of the field of the arrangement.

It will be understood that an electromagnet arrangement according to the invention may. be constructed either as a resistive arrangement, or a superconducting arrangement. In the latter case the coils are suitably housed in twin cryostats.

Figure 2:
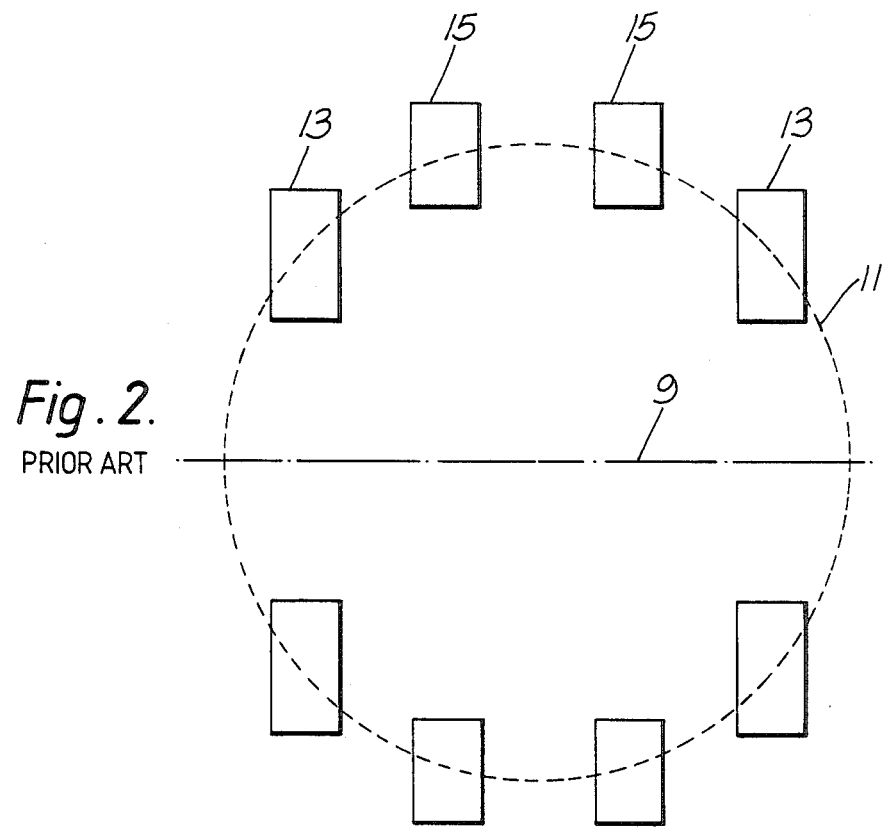

It will be appreciated that an arrangement in accordance with the invention, in addition to providing good transverse access to the centre of the magnet, and reducing claustrophobic effects in the case of use for NMR imaging of patients, is potentially cheaper than conventional arrangements as illustrated in FIGS. 1 and 2, and simpler to set up than spherical arrangements as illustrated in FIG. 2.

I claim:

1. An electromagnet arrangement comprising a single pair of substantially identical annular coils disposed coaxially in spaced relationship, and a pair of annular members of ferromagnetic material disposed coaxially with the coils symmetrically with respect to a plane which perpendicularly intersects the axis of the coils at a position centrally between the coils, the dimensions and relative positions of the coils and rings being such that, with the coils carrying substantially equal currents, at least two of the spherical harmonic field coefficients are substantially eliminated.

2. An arrangement according to claim 1 wherein the dimensions and relative positions of the coils and rings are such that the second, fourth and sixth spherical harmonic field coefficients are substantially eliminated.

3. An arrangement according to claim 2 wherein the coils and rings are dimensioned and relatively positioned so as to satisfy the relationship $$\frac{R}{Ro} = \frac{P_E}{P_D} = \frac{Q_E}{Q_D}$$

where R is the mean radius of said rings; Ro is the radius of the sphere on which the mean centres of the cross sections of said coils lie; and $P_E$, $P_D$, $Q_E$ and $Q_D$ are dimensionless quantities.

4. An arrangement according to claim 3 wherein the mean centre of the cross section of each of the coils subtends to the axis of the coils at said position where said plane intersects said axis an angle of between 53.6° and 63.4° and the mean centre of the cross-section of each of the rings subtends to said axis at said position an angle of between 58.5° and 70.5°.

5. An arrangement according to claim 3 wherein the rings are of smaller radius than the coils.

6. An arrangement according to claim 1 wherein the rings have a magnetisation arising partly by virtue of the rings being permanently magnetised.

7. An arrangement according to claim 1 wherein the rings have a magnetisation arising substantially solely from the magnetic field produced by the coils.

8. An arrangement according to claim 1 wherein said coils are connected in series.

9. An arrangement according to claim 1 wherein the rings are associated with auxilialy coils whereby the magnetisation of the rings can be adjusted.

10. An arrangement according to claim 9 wherein each ring is sandwiched between a pair of annular auxilially coils one on the inside radial surface and one on the outside radial surface of the associated ring.

11. An arrangement according to claim 10 wherein said auxiliary coils are all connected in series.

12. An arrangement according to claim 1 wherein said coils and rings are of substantially rectangular cross-section.

* * * * *